United States Patent
Hayashi et al.

(10) Patent No.: US 11,942,895 B2
(45) Date of Patent: Mar. 26, 2024

(54) PANEL CONNECTED BODY, POWER GENERATION MODULE CONNECTED BODY, AND POWER GENERATION DEVICE

(71) Applicant: ZEON CORPORATION, Tokyo (JP)

(72) Inventors: Yuki Hayashi, Tokyo (JP); Kiyoshige Kojima, Tokyo (JP); Masayoshi Yoshida, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 18/192,640

(22) Filed: Mar. 30, 2023

(65) Prior Publication Data

US 2023/0238916 A1 Jul. 27, 2023

Related U.S. Application Data

(62) Division of application No. 16/475,454, filed as application No. PCT/JP2018/002144 on Jan. 24, 2018, now abandoned.

(30) Foreign Application Priority Data

Jan. 27, 2017 (JP) .................................. 2017-013058

(51) Int. Cl.
  *H02S 30/20* (2014.01)
  *H01L 31/048* (2014.01)
  *H01L 31/049* (2014.01)

(52) U.S. Cl.
  CPC ............ *H02S 30/20* (2014.12); *H01L 31/048* (2013.01); *H01L 31/049* (2014.12)

(58) Field of Classification Search
  CPC ....... H02S 30/20; H02S 40/36; H01L 31/048; H01L 31/049; H01L 31/042; Y02E 10/50
  See application file for complete search history.

(56) References Cited

U.S. PATENT DOCUMENTS

2015/0075583 A1* 3/2015 Francis ............... H01L 31/0201
                                                              136/245
2015/0083191 A1   3/2015 Gmundner

FOREIGN PATENT DOCUMENTS

JP         H0951118 A      2/1997
JP       2001332752 A     11/2001
             (Continued)

OTHER PUBLICATIONS

Feb. 27, 2018, International Search Report issued in the International Patent Application No. PCT/JP2018/002144.

(Continued)

*Primary Examiner* — Angelo Trivisonno
(74) *Attorney, Agent, or Firm* — KENJA IP LAW PC

(57) ABSTRACT

A panel connected body includes a plurality of flat panels arranged in a matrix of m rows and n columns, where $m \geq 3$ and $n \geq 3$; and a plurality of row-direction connection portions and column-direction connection portions which connect together panels that are adjacent in a row direction and column direction, respectively. A first type row satisfying relationships $D_1 \geq 2L$ and $D_y \geq D_{y-1} - 2L$ and a second type row satisfying relationships $D_n \geq 2L$ and $D_y \geq D_{y+1} + 2L$ are alternately included, where $D_y$ is a length along the column direction of the column-direction connection portions in a y-th column, and L is a thickness of the panels. The relationship $E \leq W_C - L$ is satisfied, where $W_C$ is a length along the column direction of the panels and E is a length along the column direction of the row-direction connection portions.

9 Claims, 14 Drawing Sheets

(56) References Cited

FOREIGN PATENT DOCUMENTS

JP          2004090817 A      3/2004
JP          2007032171 A      2/2007

OTHER PUBLICATIONS

Jul. 30, 2019, International Preliminary Report on Patentability issued in the International Patent Application No. PCT/ JP2018/ 002144.
Jun. 12, 2020, the Extended European Search Report issued by the European Patent Office in the corresponding European Patent Application No. 18744448.4.

* cited by examiner

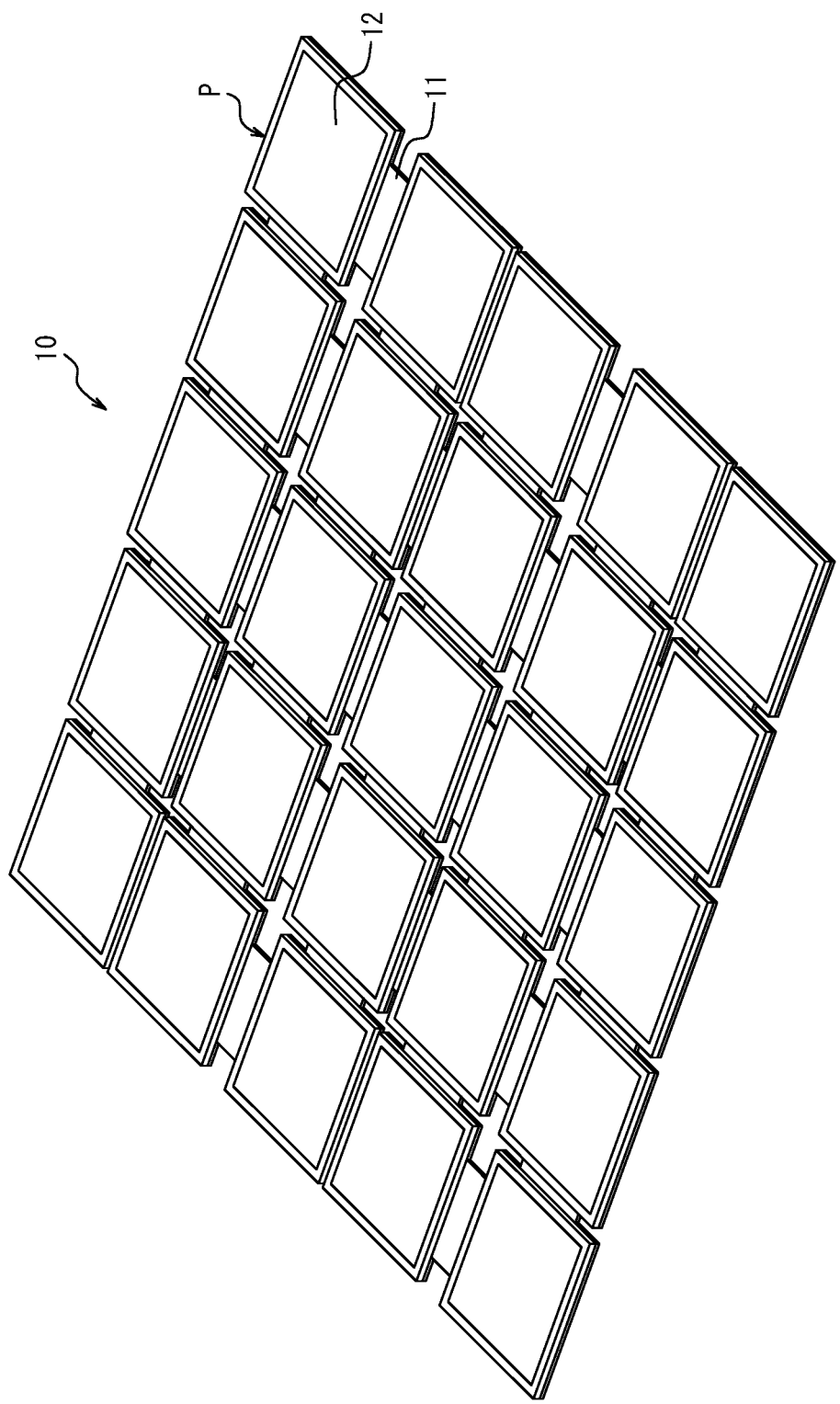

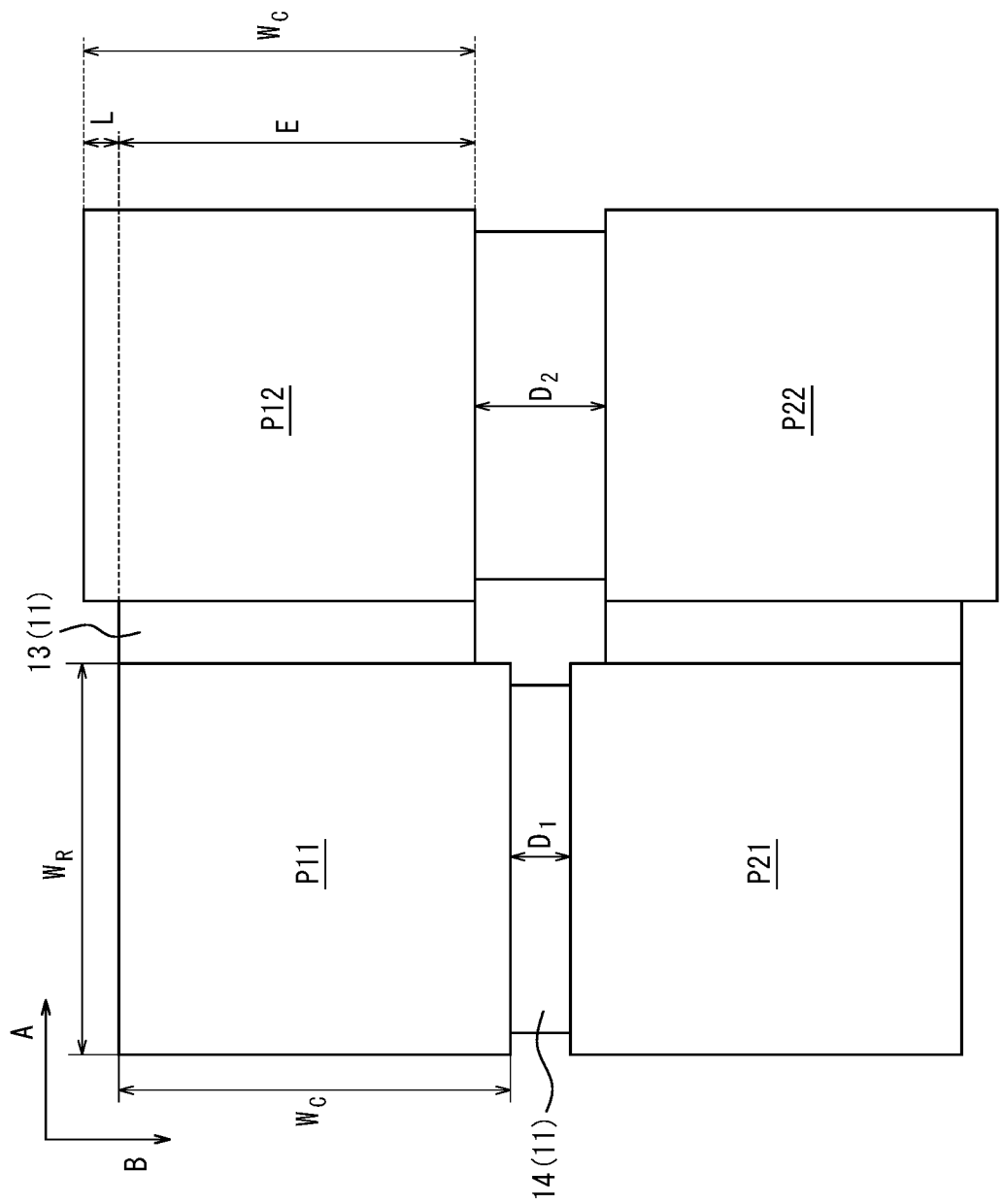

PANEL CONNECTED BODY, POWER GENERATION MODULE CONNECTED BODY, AND POWER GENERATION DEVICE

CROSS-REFERENCE TO RELATED APPLICATIONS

The present application is a divisional application of U.S. patent application Ser. No. 16/475,454 filed Jul. 2, 2019, which is a National Stage Application of PCT/JP2018/002144 filed Jan. 24, 2018, which claims priority of Japanese Patent Application No. 2017-013058 filed Jan. 27, 2017. The disclosures of the prior applications are hereby incorporated by reference herein in their entirety.

TECHNICAL FIELD

The present disclosure relates to a panel connected body, a power generation module connected body, and a power generation device.

BACKGROUND

In recent years, there has been growing demand for portable power generation devices to enable users to use mobile devices such as smartphones, notebook personal computers (PCs) and tablet PCs even when they are outside with no access to a commercial power supply.

For example, JPH9-51118A (PTL 1) discloses a sheet-shaped solar cell (photoelectric conversion module connected body) in which a plurality of solar cells (photoelectric conversion modules) arranged with a predetermined spacing and a flexible conductive member (connection portion) connecting electrodes of the solar cells are sandwiched vertically between sheet-shaped transparent film members having flexibility and elasticity. When in use, the photoelectric conversion module connected body can be unfolded to extract electric power generated by the photoelectric conversion modules and use the electric power in an external device. When not in use, the sheet-shaped solar cell can be folded to be easily stored or carried.

There are other foldable panel connected bodies besides photoelectric conversion module connected bodies. For example, JP2007-32171A (PTL 2) discloses a foldable board (panel connected body) configured to sequentially increase or decrease the widths of gussets corresponding to laterally extending folds. Such a panel connected body can be conveniently stored or transported in a folded state even though it has a certain thickness.

CITATION LIST

Patent Literatures

PTL 1: JPH9-51118A
PTL 2: JP2007-32171A

SUMMARY

Technical Problem

The photoelectric conversion module connected body disclosed in PTL 1 can be folded and stored when not in use, as described above. However, the photoelectric conversion module connected body is only intended to be folded in one direction (column direction), and has room for improvement in storability. The panel connected body disclosed in PTL 2 has the gusset widths defined based on the thickness of the board, but has room for improvement in storability.

An object of the present disclosure is to provide a panel connected body, a power generation module connected body and a power generation device having improved storability.

Solution to Problem

A presently-disclosed panel connected body comprises: a plurality of flat panels arranged in a matrix of m rows and n columns, where $m \geq 2$ and $n \geq 2$; a plurality of row-direction connection portions which connect together the panels that are adjacent in a row direction; and a plurality of column-direction connection portions which connect together the panels that are adjacent in a column direction, wherein the panel connected body is foldable between adjacent panels of the plurality of panels, a first type row satisfying relationships $D_1 \geq 2L$ and $D_y \geq D_{y-1}+2L$ and a second type row satisfying relationships $D_n \geq 2L$ and $D_y \geq D_{y+1}+2L$ are alternately included, where $D_y$ is a length along the column direction of the column-direction connection portions in a y-th column, and L is a thickness of the panels, the panel connected body satisfies a relationship $E \geq W_C - L$, where $W_C$ is a length along the column direction of the panels, and E is a length along the column direction of the row-direction connection portions, and opposing ends in the column direction of the row-direction connection portions do not protrude outward in the column direction beyond any of the panels connected together with the row-direction connection portions. With such a configuration, the panel connected body can be smoothly folded without being obstructed by the column-direction connection portions located on the inner side during folding, and also the row-direction connection portions do not protrude outward beyond the panels in the column direction. Such a panel connected body thus has improved storability.

Preferably, the presently-disclosed panel connected body satisfies the relationship $E \leq W_C - L \times (n-1)$ and opposing ends in the column direction of the plurality of row-direction connection portions arranged in the same row are aligned along the row direction. Such a configuration improves design and productivity.

Preferably, the presently-disclosed panel connected body comprises, alternately in the row direction, a first column satisfying the relationships $C_1 \geq 2L$ and $C_x \geq C_{x-1}+2L$ and a second column satisfying relationships $C_m \geq 2L$ and $C_x \geq C_{x+1}+2L$, where $C_x$ is a length along the row direction of the row-direction connection portions in an x-th row. With such a configuration, the panel connected body can be folded in any of the row direction and the column direction to be in a stored state.

Preferably, in the presently-disclosed panel connected body, the first row is the first type row and the first column is the second type column, or the first row is the second type row and the first column is the first type column. With such a configuration, each panel is prevented from being far from both of a panel adjacent in the row direction and a panel adjacent in the column direction. The stability of the panels can thus be improved.

Preferably, the presently-disclosed panel connected body satisfies the relationship $F \leq W_R - L$, where $W_R$ is a length along the row direction of the panels and F is a length along the row direction of the row-direction connection portions, and opposing ends in the row direction of the column-direction connection portions do not protrude outward in the row direction beyond any of the panels connected together with the column-direction connection portions. This configuration further improves storability.

Preferably, the presently-disclosed panel connected body satisfies the relationship $F \leq W_R - L \times (m-1)$ and opposing ends in the row direction of the plurality of column-direction connection portions arranged in the same column are aligned. Such a configuration further improves design and productivity.

A presently-disclosed power generation module connected body comprises the panel connected body, wherein the panels are power generation modules, and at least one of the row-direction connection portion and the column-direction connection portion comprises a conductor electrically connecting the power generation modules. With such a configuration, the same advantageous effects as above can be achieved in a power generation module connected body.

Preferably, in the presently-disclosed power generation module connected body, at least one of the row-direction connection portion and the column-direction connection portion is located along a lower end of the power generation module connected body, and further comprises a conductor layer and a protective layer stacked in the vertical direction, and the protective layer is located closer to the lower end than the conductor layer. With such a configuration, when the power generation module connected body is folded between adjacent power generation modules, the protective layer or the power generation module is located on the inner side of the conductor layer. This prevents an excessive bending force on the conductor layer, and prevents a break of the conductor.

The presently-disclosed power generation module connected body comprises the power generation modules which are photoelectric conversion modules.

A presently-disclosed power generation device comprises: the power generation module connected body; and a main body electrically connected to the power generation module connected body. With such a configuration the same advantageous effects as above can be achieved in a power generation device.

Advantageous Effect

It is therefore possible to provide a panel connected body, a power generation module connected body and a power generation device having improved storability.

BRIEF DESCRIPTION OF THE DRAWINGS

In the accompanying drawings:

FIG. 2 is a perspective view of the power generation module connected body illustrated in FIG. 1 in an unfolded state;

FIG. 6 is an enlarged view of another example of the column-direction width of the row-direction connection portions illustrated in FIG. 3A;

DETAILED DESCRIPTION

One of the disclosed embodiments is described below with reference to the drawings.

Figure 3A:
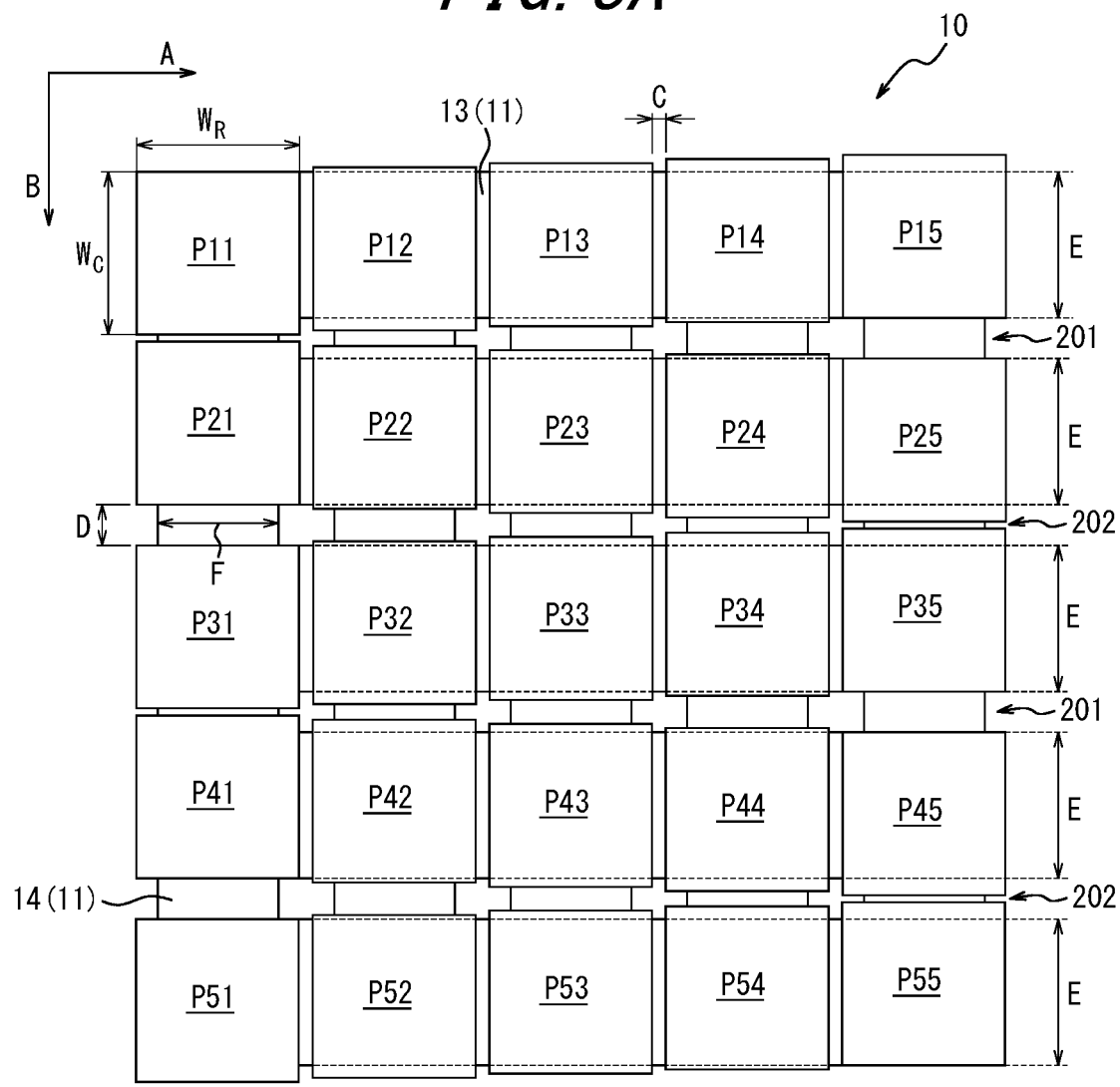
FIG. 3A is a top view of the power generation module connected body illustrated in FIG. 1 in an unfolded state.

Herein, the term "vertical direction" refers to the direction perpendicular to the paper surface of a top view of a power generation module connected body in FIG. 3A, etc. The term "upward" refers to the direction to the front from the paper surface in the drawing, and the term "downward" refers to the direction opposite to the upward direction. The term "front side" refers to the upward facing side of the power generation module connected body in an unfolded state, and the term "back side" refers to a side opposite to the front side. The term "row direction A" refers to the rightward direction in top a view of a power generation module connected body in FIG. 3A, etc., and the term "column direction B" refers to the downward direction in the top view.

Figure 1:
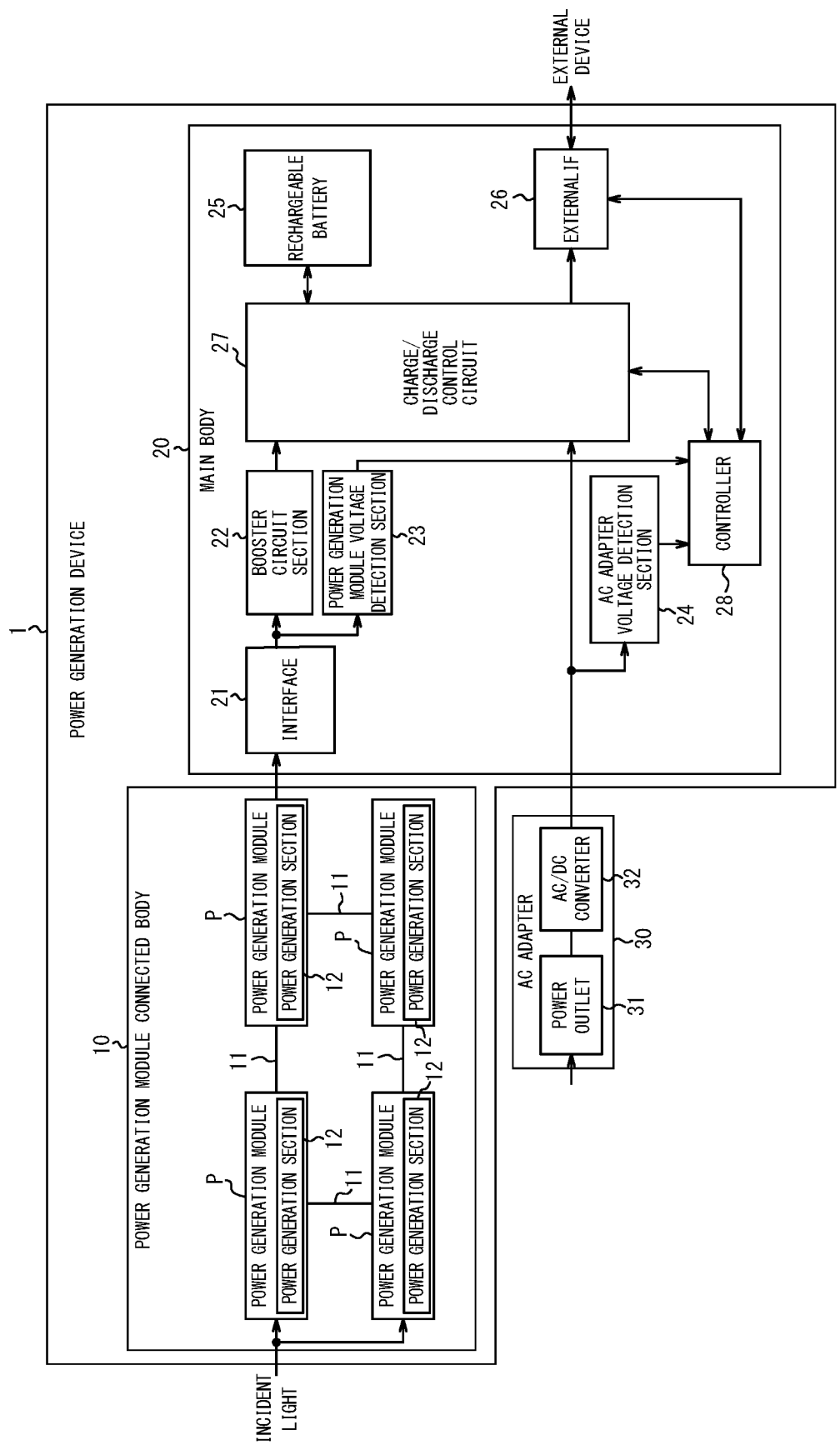
FIG. 1 is a block diagram illustrating a schematic structure of a power generation device according to one of the disclosed embodiments.

FIG. 1 is a block diagram illustrating a schematic structure of a power generation device 1 according to one of the disclosed embodiments.

As illustrated in FIG. 1, the power generation device 1 according to this embodiment includes a power generation module connected body 10 and a main body 20. The power generation device 1 can be supplied with power from a commercial power supply via an AC adapter 30. The AC adapter 30 includes a power outlet 31 and an AC/DC converter 32. The AC/DC converter 32 receives input of an AC voltage from the commercial power supply via the power outlet 31, converts the input AC voltage to a DC voltage, and supplies the DC voltage to the main body 20.

The power generation module connected body 10 includes a plurality of power generation modules P and a connection portion 11. The connection portion 11 mechanically and electrically connects the power generation modules P to each other.

Each power generation module P is a flat panel in appearance. FIG. 1 illustrates four power generation modules P, but the number of the power generation modules P is not limited to 4. Each power generation module P includes a power generation section 12. The power generation section 12 is, for example, a solar cell made of solar cells configured to photoelectrically convert incident light, such as sunlight or room light, and outputs electric power. The power generation section 12 is not limited to a solar cell and may be a power generator that generates electric power utilizing energy other than incident light, such as geothermal heat. The power generation module P includes a substrate (not illustrated) for supporting the power generation section 12, extraction wiring (not illustrated) for extracting electric power generated by the power generation section 12, and the like, in addition to the power generation section 12.

Solar cells used as the power generation section 12 are broadly classified into two types: inorganic solar cells in which an inorganic material is used and organic solar cells in which an organic material is used. Examples of inorganic solar cells include Si solar cells in which silicon (Si) is used and compound solar cells in which a compound is used. Examples of organic solar cells include thin-film solar cells such as low-molecular vapor deposition-type solar cells in which an organic pigment is used, polymer coating-type solar cells in which a conductive polymer is used, and coating-conversion-type solar cells in which a conversion-type semiconductor is used; and dye-sensitized solar cells formed from titania, an organic dye, and an electrolyte. Other examples of solar cells included used as the power generation section 12 include organic/inorganic hybrid solar cells and solar cells in which a perovskite compound is used. In the present disclosure, a thin panel-shaped solar cell panel is used as the solar cell, and a dye-sensitized solar cell formed using a plastic film or the like is preferable. The thin panel-shaped solar cell panel is not limited to a panel formed using a plastic film or the like, and may be any type as long as it is a similar thin panel.

The main body 20 includes an interface 21, a booster circuit section 22, a power generation module voltage detection section 23, an AC adapter voltage detection section 24, a rechargeable battery 25, an external interface (IF) 26, a charge/discharge control circuit 27, and a controller 28.

The interface 21 is a device for mechanically and electrically connecting each power generation module P to the main body 20. The interface 21 may connect the power generation module P removably. The interface 21 outputs electric power supplied from the connected power generation module P, to the booster circuit section 22.

The booster circuit section 22 boosts the voltage of the electric power supplied from the power generation module P via the interface 21 to a predetermined voltage required for charging the rechargeable battery 25, and outputs the resultant voltage to the charge/discharge control circuit 27.

The power generation module voltage detection section 23 detects a voltage (power generation module voltage) supplied from the power generation module P connected to the interface 21 of the main body 20 to the booster circuit section 22 via the interface 21, and outputs the result of the detection to the controller 28.

The AC adapter voltage detection section 24 detects a voltage (AC adapter voltage) supplied from the AC adapter 30 to the charge/discharge control circuit 27, and outputs the result of the detection to the controller 28.

The rechargeable battery 25 is a battery that can be charged and discharged, such as a lead-acid battery or a lithium ion secondary battery.

The external interface (IF) 26 is an interface capable of connecting to an external device and supplying electric power to the connected external device. The external IF 26 is not limited, and is, for example, a connector (USB connector) using a USB (Universal Serial Bus) interface or a cable having a connector at its end. The external IF 26 connects to the external device and, for example in response to a charging request from the external device, supplies electric power to the external device. The power generation device 1 can be mechanically and electrically attached to and removed from various devices to be charged, such as a mobile phone, a smartphone, a tablet device, and a personal computer, via the external IF 26.

The charge/discharge control circuit 27 performs charge/discharge control among the booster circuit section 22, the AC adapter 30, the rechargeable battery 25, and the external device connected via the external IF 26.

The controller 28 controls operation of each section of the main body 20. For example, the controller 28 controls the charge/discharge control circuit 27 to control paths for charging and discharging, based on the detection result of the power generation module voltage detection section 23, the detection result of the AC adapter voltage detection section 24, the charge level of the rechargeable battery 25, and so on.

Figure 3B:
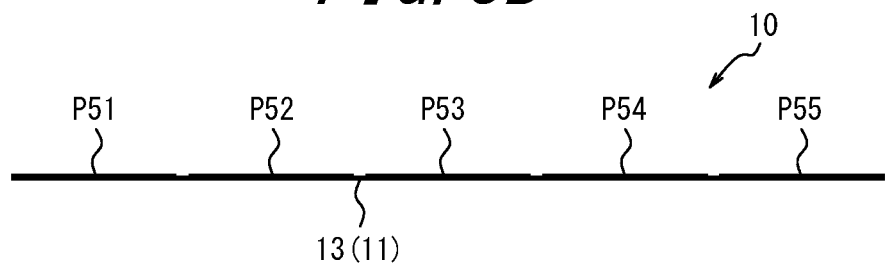
FIG. 3B is a front view of the power generation module connected body illustrated in FIG. 1 in an unfolded state.
Figure 4A:
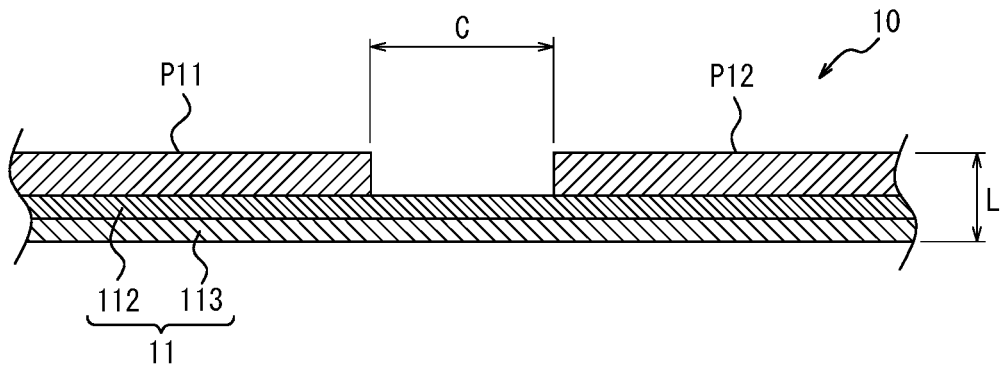
FIGS. 4A to 4C are partially enlarged sectional views of the power generation module connected body illustrated in FIG. 1 in an unfolded state.
Figure 4B:
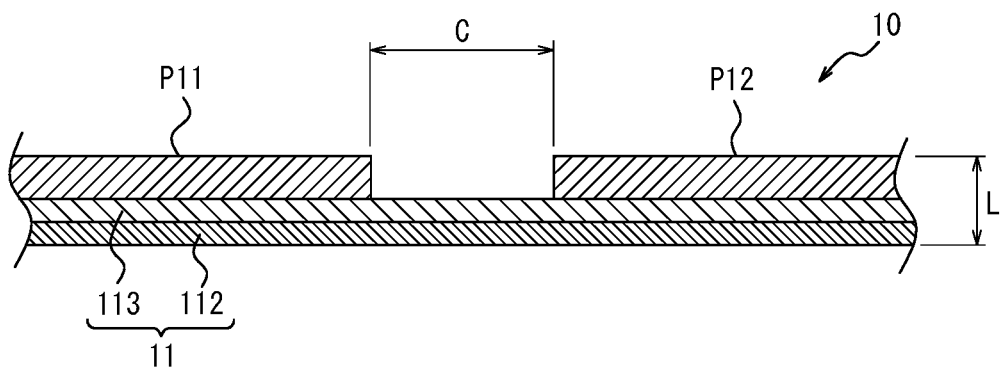
Figure 4C:
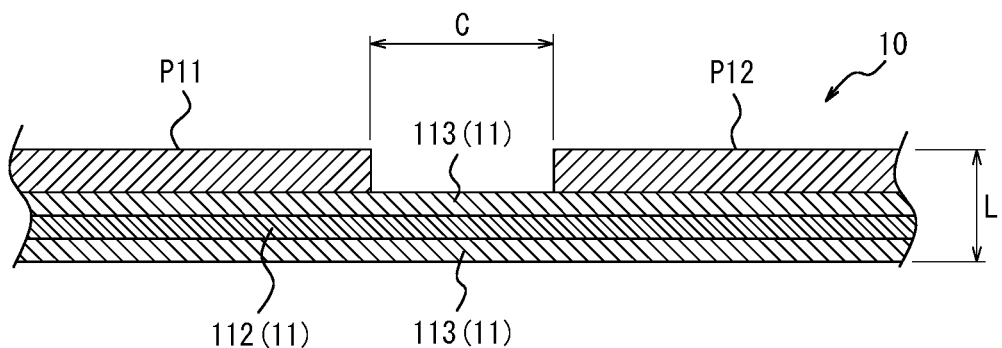
Figure 5:
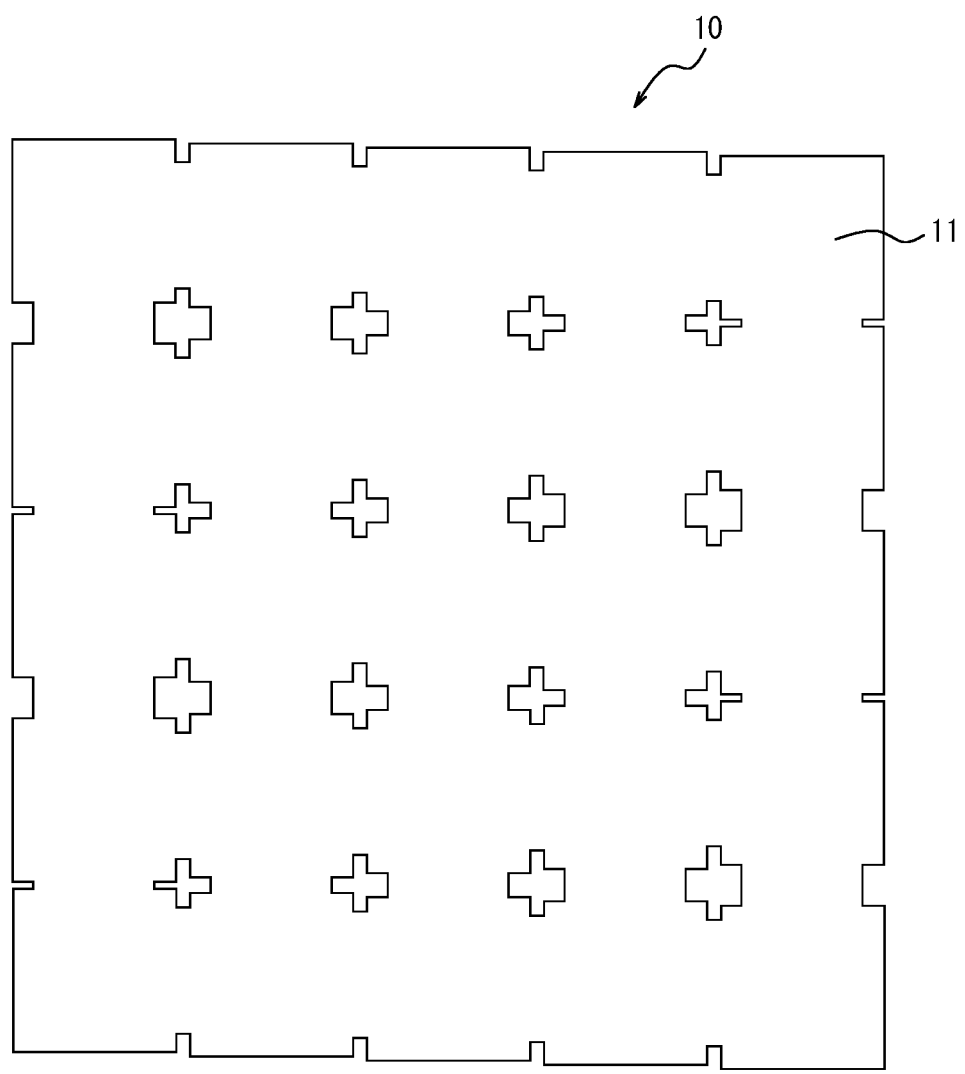
FIG. 5 is a bottom view of the power generation module connected body illustrated in FIG. 1 in an unfolded state.

The structure of the power generation module connected body 10 included in the power generation device 1 is described in more detail below, with reference to FIGS. 2 to 6. FIGS. 2 to 5 are illustrations of the power generation module connected body 10 according to this embodiment in an unfolded state. FIG. 2 is a perspective view, FIG. 3A is a top view, FIG. 3B is a front view, FIGS. 4A to 4C are partially enlarged sectional views along the row direction, and FIG. 5 is a bottom view.

Herein, the "unfolded state" is a state in which, in order to generate electric power using the power generation device 1, the power generation modules P are unfolded so as not to overlap each other, such that the power generation module connected body 10 is planar as a whole. In contrast to the unfolded state, the "stored state" refers to a state in which, in order to store the power generation device 1, adjacent power generation modules P are folded so that all power generation modules P overlap in the vertical direction, as described later with reference to FIGS. 9A and 9B. The unfolded state and the stored state are defined for the sake of convenience, to describe the state of the power generation module connected body 10. The power generation module connected body 10 may be used for power generation with some of the power generation modules P being folded, or stored with some of the power generation modules P being not folded.

As illustrated in FIGS. 2 and 3A, the power generation module connected body 10 has the power generation modules P arranged in a matrix of 5 rows and 5 columns, in an unfolded state. The power generation modules P are mechanically and electrically connected by the connection portion 11 in the row direction A and in the column direction B. Specifically, as illustrated in FIG. 3A, the connection portion 11 includes row-direction connection portions 13 and column-direction connection portions 14, so that power generation modules P which are adjacent to each other along the row direction A are connected together with the row-direction connection portions 13 and power generation modules P which are adjacent to each other along the column direction B are connected together with the column-direction connection portions 14. At least one of the row-direction connection portion 13 and the column-direction connection portion 14 includes a conductor that electrically connects the power generation modules P. In this example, each power generation module P is rectangular in top view. Each power generation module P may be covered with a casing to provide environmental resistance. Although it is preferable that each power generation module P has a certain degree of flexibility, each power generation module P has at least such rigidity that is higher than that of the connection portion 11 between the power generation modules P and resists folding. Each power generation module P is preferably covered on its periphery with a frame which is a rigid member with particularly high rigidity. By covering the power generation module P with such a frame, for example, flexural deformation of the power generation module P caused by stress from the connection portion 11 can be prevented.

Hereinafter, as illustrated in FIG. 3A, the length along the row direction A of the row-direction connection portions 13 (hereinafter "row-direction length" as appropriate) is defined as C, and the length along the column direction B of the column-direction connection portions 14 (hereinafter "column direction length" as appropriate) is defined as D. The length along the column direction B of the row-direction connection portions 13 (hereinafter "column-direction width" as appropriate) is defined as E, and the length along the row direction A of the column-direction connection portions 14 (hereinafter "row-direction width" as appropriate) is defined as F. The length along the row direction A of the power generation modules P is defined as $W_R$, and the length along the column direction B of the power generation modules P is defined as $W_C$.

Each power generation module P has the power generation section 12 exposed upward, as illustrated in FIG. 2. The power generation module P includes extraction wiring connected to the power generation section 12. The power generation module P extracts electric power generated by the power generation section 12 through the extraction wiring, and outputs the electric power to, for example, the interface 21 of the main body 20 via the connection portion 11 and/or other power generation modules P. The power generation section 12 in the power generation module P may be disposed to be capable of receiving incident light in a direction other than from above, for example, from below, to generate power.

The connection portion 11 is a connection member having flexibility. The connection portion 11 mechanically connects the power generation modules P in the row direction A and in the column direction B, and is configured so that the power generation modules P connected via the connection portion 11 are foldable. The connection portion 11 preferably has higher flexibility than the power generation modules P from the viewpoint of foldability. The connection portion 11 includes a conductor (not illustrated) that electrically connects the power generation modules P. The conductor is located to electrically connect any adjacent power generation modules P to each other. The thickness of the connection portion 11 in the vertical direction is not greater than the thickness of the power generation modules P in the vertical direction. The thickness of the connection portion 11 in the vertical direction is preferably less than the thickness of the power generation modules P in the vertical direction, as illustrated in FIGS. 4A to 4C.

As illustrated in FIGS. 4A to 4C, preferably, at least one of the row-direction connection portion 13 and the column-direction connection portion 14 as the connection portion 11 is located along the lower end of the power generation module connected body 10 and includes a conductor layer 112 and a protective layer 113 stacked in the vertical direction. The conductor layer 112 is a layer including a conductor, and is composed of, for example, a conductive member such as a conductive cable and/or a flexible board. The protective layer 113 is composed of, for example, a covering member for protecting and/or reinforcing the conductor layer 112. For example, the connection portion 11 may have the protective layer 113 and the conductor layer 112 arranged in the order mentioned upward from the lower end as illustrated in FIG. 4A, have the conductor layer 112 and the protective layer 113 arranged in the order mentioned upward from the lower end as illustrated in FIG. 4B, or have the protective layer 113, the conductor layer 112, and the protective layer 113 arranged in the order mentioned upward from the lower end as illustrated in FIG. 4C. In the case where the protective layer 113 is located closer to the lower end than the conductor layer 112 as illustrated in FIGS. 4A and 4C, when folding the power generation module connected body 10 between adjacent power generation modules P, the protective layer 113 or the power generation module P is located on the inner side of the conductor layer 112. This prevents an excessive bending force on the conductor layer 112, and suppresses a break of the conductor. In the case where the protective layer 113 is located above the conductor layer 112 as illustrated in FIGS. 4B and 4C, the conductor layer 112 can be further protected and/or reinforced.

The connection portion 11 is configured to satisfy the relationship "row-direction length C≥2L", where L is the thickness in the vertical direction of the power generation modules P as illustrated in FIGS. 4A to 4C. In the case where the connection portion 11 is present above or below the power generation module P, the thickness L in the vertical direction of the power generation modules P is taken as thickness of the whole power generation module connected body 10 including the thickness of the connection portion 11, as illustrated in FIGS. 4A to 4C. For example, the thickness L in the vertical direction of the power generation modules P is preferably 3 mm or less from the viewpoint of production technology. The lower limit of the thickness of the power generation modules P is preferably about 10 μm.

Let n be the number (integer of 2 or more) of columns of the plurality of power generation modules P arranged in a matrix. When the column-direction length of the column-direction connection portions 14 in the y-th column is defined as $D_y$, in the power generation module connected body 10, a first type row 201 satisfying the relationships $D_1 \geq 2L$ and $D_y \geq D_{y-1} + 2L$ (see FIG. 3A) and a second type row 202 satisfying the relationships $D_n \geq 2L$ and $D_y \geq D_{y+1} + 2L$ (see FIG. 3A) are alternately arranged along the column direction B. In other words, the column-direction length D of the column-direction connection portions 14 is 2L or more for the first type row 201 in the first column and increases by 2L or more with each increase in the number of columns. The column-direction length D of the column-direction connection portions 14 is 2L or more in the last column for the second type row 202 and increases by 2L or more with each decrease in the number of columns.

In detail, as illustrated in FIG. 3A, the column-direction length D of the 5 column-direction connection portions 14 which connect together the 5 power generation modules P (P11, P12, P13, P14, P15) of the first row and the 5 power generation modules P (P21, P22, P23, P24, P25) of the second row which are adjacent in the column direction B satisfies the relationships $D_1 \geq 2L$, $D_2 \geq D_1 + 2L$, $D_3 \geq D_2 + 2L$, $D_4 \geq D_3 + 2L$, $D_5 \geq D_4 + 2L$ sequentially from the first column, forming the first type row 201. Likewise, the column-direction length D of the 5 column-direction connection portions 14 which connect together the 5 power generation modules P (P31, P32, P33, P34, P35) of the third row and the 5 power generation modules P (P41, P42, P43, P44, P45) of the fourth row which are adjacent in the column direction B satisfies the relationships $D_1 \geq 2L$, $D_2 \geq D_1+2L$, $D_3 \geq D_2+2L$, $D_4 \geq D_3+2L$, $D_5 \geq D_4+2L$ sequentially from the first column, forming the first type row 201.

Meanwhile, the column-direction length D of the 5 column-direction connection portions 14 which connect together the 5 power generation modules P (P21, P22, P23, P24, P25) of the second row and the 5 power generation modules P (P31, P32, P33, P34, P35) of the third row which are adjacent in the column direction B satisfies the relationships $D_1 \geq D_2+2L$, $D_2 \geq D_3+2L$, $D_3 \geq D_4+2L$, $D_4 \geq D_5+2L$, $D_5 \geq 2L$ sequentially from the first column, forming the second type row 202. Likewise, the column-direction length D of the 5 column-direction connection portions 14 which connect the 5 power generation modules P (P41, P42, P43, P44, P45) of the fourth row and the 5 power generation modules P (P51, P52, P53, P54, P55) of the fifth row which are adjacent in the column direction B satisfies the relationships $D_1 \geq D_2+2L$, $D_2 \geq D_3+2L$, $D_3 \geq D_4+2L$, $D_4 \geq D_5+2L$, $D_5 \geq 2L$ sequentially from the first column, forming the second type row 202. In this way, in the power generation module connected body 10, the first type row 201 and the second type row 202 are alternately arranged along the column direction B.

In the example illustrated in FIG. 3A, the column-direction length D of the 5 column-direction connection portions 14 which connect together the 5 power generation modules P (P11 to P15) of the first row and the 5 power generation modules P (P21 to P25) of the second row which are adjacent in the column direction B satisfies the relationships $D_2 = D_1+2L$, $D_3 = D_2+2L$, $D_4 = D_3+2L$, $D_5 = D_4+2L$. In this case, the power generation modules P in the first row are offset with respect to each other by a distance equal to length L in the direction opposite to the column direction B. Hence, the power generation modules P in the n-th column are offset with respect to the power generation modules P in the first column by a distance equal to length $L \times (n-1)$ in the direction opposite to the column direction B. In the example illustrated in FIG. 3A, the power generation module P15 at the far right is offset with respect to the power generation module P11 at the far left by a distance equal to length 4L in the direction opposite to the column direction B.

The column-direction width E of the row-direction connection portions 13 satisfies the relationship $E = W_C - L \times (n-1)$. Because the power generation module connected body 10 has 5 columns of power generation modules P (n=5) in this example, the relationship $E = W_C - 4L$ is satisfied. Further, as illustrated in FIG. 3A, opposing ends in the column direction B of the plurality of row-direction connection portions 13 arranged in the same row are aligned along the row direction A.

At this point of time, the positions of one ends in the column direction B (upper ends in FIG. 3A) of the respective the row-direction connection portions 13 which connect together the 5 power generation modules P (P11 to P15) of the first row are aligned in the column direction B with the position of one end in the column direction B (upper end in FIG. 3A) of the power generation module P11 which is positioned lowermost in the column direction B among the 5 power generation modules P of the first row in FIG. 3A. Further, the positions of the other ends in the column direction B (lower ends in FIG. 3A) of the respective row-direction connection portions 13 which connect together the power generation modules of the first row are aligned in column direction B with the position of the other end (lower end in FIG. 3A) of the power generation module P15 positioned uppermost in the column direction B among the 5 power generation modules P of the first row in FIG. 3A. Thus, opposing ends in the column direction B of the row-direction connection portions 13 do not protrude outward in the column direction B beyond any of the power generation modules P connected together with the row-direction connection portions 13. It is thus possible to improve the storability of the power generation module connected body 10.

The relationship above that holds true for the row-direction connection portions 13 which connect together the power generation modules P (P11 to P15) of the first row also holds true for the row-direction connection portions 13 which connect together the power generation modules P (P31 to P35) of the third row, and for the row-direction connection portions 13 which connect together the power generation modules P (P51 to P55) of the fifth row. For the row-direction connection portions 13 which connect together the power generation modules P (P21 to P25) of the second row and the row-direction connection portions 13 which connect together the power generation modules P (P41 to P45) of the fourth row, a relationship in which the above relationship is reversed left and right holds true.

When the power generation module connected body 10 is configured such that the column-direction width E of the row-direction connection portions 13 satisfies the relationship $E \leq W_C - L \times (n-1)$, opposing ends in the column direction B of the plurality of row-direction connection portions 13 arranged in the same row can be aligned in the row direction A, thus improving design. As illustrated in FIGS. 4A to 4C, when the connection portion 11 is located to cover the entire surface along the lower end of the power generation module connected body 10, opposing ends in the column direction B of the plurality of row-direction connection portions 13 arranged in the same row are aligned along the row direction A. With this configuration, it is possible to simplify the shape of the outer periphery of the connection portion 11. Because it is possible to simplify the machining process of the connection portion 11, it is possible to increase productivity.

FIG. 6 is an enlarged view of another example of the column-direction width E of the row-direction connection portions 13. In the example illustrated in FIG. 6, the column-direction length D of the column-direction connection portions 14 which connect together the two power generation modules P (P11, P12) of the first row and the two power generation modules P (P21, P22) of the second row which are adjacent in the column direction satisfies the relationship $D_2 = D_1+2L$. In this case, the power generation module P12 positioned right to the power generation module P11 is offset with respect to the power generation module P11 by a distance equal to length L in the direction opposite to the column direction B.

In the example illustrated in FIG. 6, the column-direction width E of the row-direction connection portions 13 satisfies the relationship $E = W_C - L$. The position of one end in the column direction B (upper end in FIG. 6) of the row-direction connection portion 13 which connects together the power generation modules P11 and P12 is aligned in column direction B with the position of one end in the column direction B (upper end in FIG. 6) of the power generation module P11. Further, the position of the other end in the column direction B (lower end in FIG. 6) of the row-direction connection portion 13 which connects together the power generation modules P11 and P12 is aligned in column direction B with the position of the other end in the column direction B (lower end in FIG. 6) of the power generation module P12.

In the example illustrated in FIG. 6, as opposed to the first row, the power generation module P22 of the second row is offset with respect to the power generation module P21 of the second row by a distance equal to length L in the column direction B. The position of one end in the column direction B (upper end in FIG. 6) of the row-direction connection portion 13 which connects together the power generation modules P21 and P22 is aligned in column direction B with the position of one end in the column direction B (upper end in FIG. 6) of the power generation module P22. Further, the position of the other end in the column direction B (lower end in FIG. 6) of the row-direction connection portion 13 which connects together the power generation modules P21 and P22 is aligned in column direction B with the position of the other end in the column direction B (lower end in FIG. 6) of the power generation module P21.

FIG. 6 illustrates a row-direction connection portion 13 which connects together the power generation modules P (P11, P12) of the first and second columns in the first row, and a row-direction connection portion 13 which connects together the power generation modules P (P21, P22) of the first and second columns in the second row. The same relationship holds true for any row-direction connection portion 13. Specifically, when the first row is taken as an example, the power generation module P13 of the third column (not illustrated) is offset with respect to the power generation module P12 of the second column by a distance equal to length L in the direction opposite to the column direction B. The position of one end in the column direction B (upper end in FIG. 6) of the row-direction connection portion 13 which connects together the power generation modules P (P12, P13) of the second and third columns is aligned in column direction B with the position of one end in the column direction B (upper end in FIG. 6) of the power generation module P12. Further, the position of the other end in the column direction B (lower end in FIG. 6) of the row-direction connection portion 13 which connects together the power generation modules P (P12, P13) of the second and third columns is aligned in column direction B with the position of the other end in the column direction B (lower end in FIG. 6) of the power generation module P13. At this point of time, the row-direction connection portion 13 which connects together the power generation modules P (P12, P13) of the second and third columns is offset with respect to the row-direction connection portion 13 which connects together the power generation modules P (P11, P12) of the first and second columns by a distance equal to length L in the direction opposite to the column direction B. Thus, when the column-direction width E of the row-direction connection portions 13 satisfies the relationship $E=W_C-L$, as opposed to the example illustrated in FIG. 3A, opposing ends in the column direction B of the plurality of row-direction connection portions 13 arranged in the same row are offset with respect to each other by a distance equal to length L along the column direction B.

Thus, even if the column-direction width E of the row-direction connection portions 13 does not satisfy the relationship $E \leq W_C - L \times (n-1)$, the power generation module connected body 10 is configured such that the relationship $E \leq W_C - L$ is satisfied. With this configuration, it is possible to prevent opposing ends in the column direction B of the row-direction connection portions 13 from protruding outward in the column direction B beyond any of the power generation modules P connected together with the row-direction connection portions 13. It is thus possible to improve the storability of the power generation module connected body 10.

With reference to FIGS. 7A to 9B, a process in which the power generation module connected body 10 according to this embodiment is folded from an unfolded state to be in a stored state is described below.

Figure 7A:
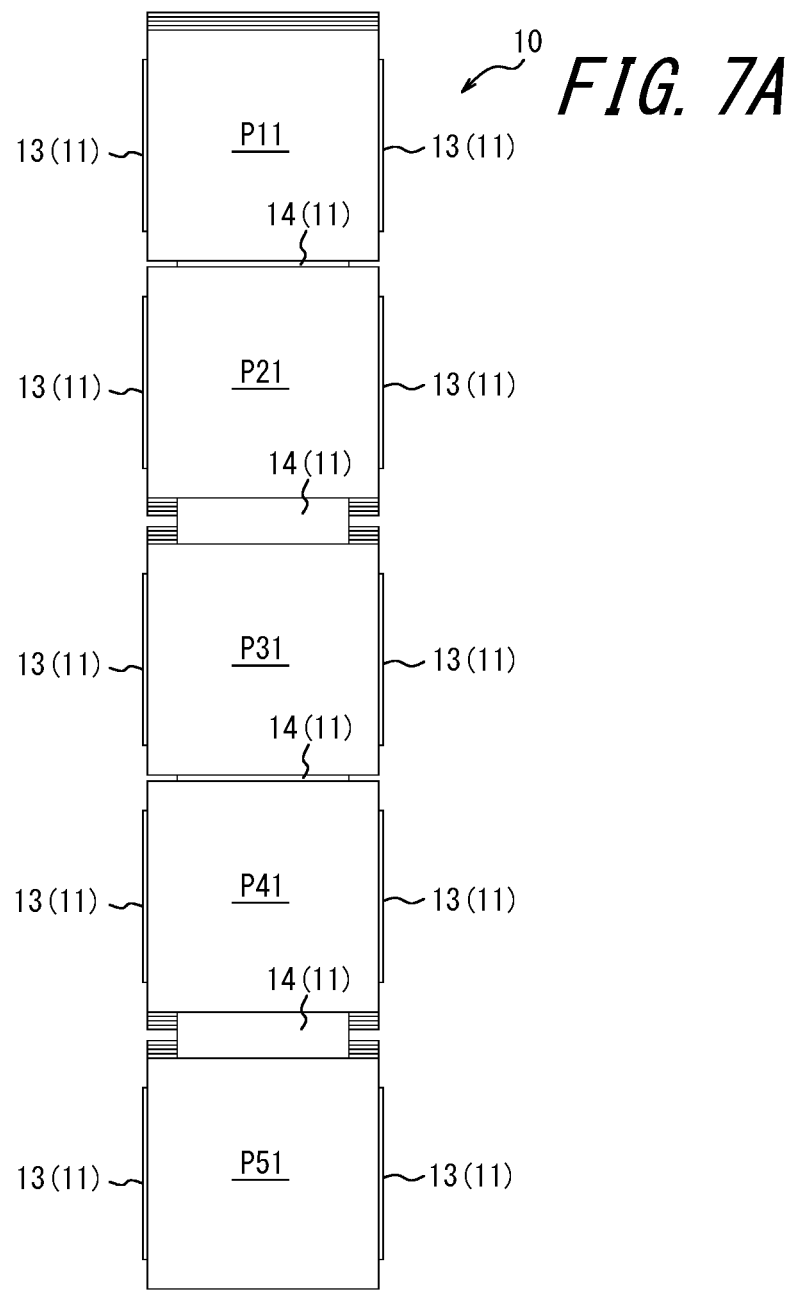
FIG. 7A is a top view of the power generation module connected body illustrated in FIG. 1 in a row direction folded state.
Figure 7B:
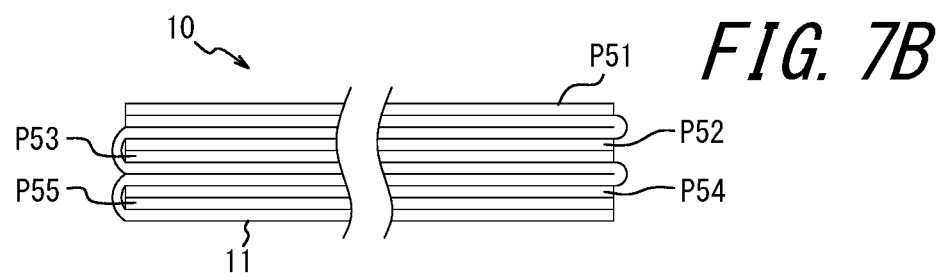
FIG. 7B is a front view of the power generation module connected body illustrated in FIG. 1 in a row direction folded state.

FIG. 7A is a top view of the power generation module connected body 10 in a state of being folded in the row direction (hereafter referred to as "row direction folded state" as appropriate). FIG. 7B is a front view of the power generation module connected body 10 in a state of being folded in the row direction. As a result of being folded in the row direction A from the unfolded state illustrated in FIGS. 3A and 3B, the power generation module connected body 10 is put in a row direction folded state as illustrated in FIGS. 7A and 7B. In detail, as a result of alternate folding (i.e. accordion folding) in the row direction between power generation modules P of columns adjacent in the row direction, the power generation module connected body 10 is put in a row direction folded state.

First, the power generation modules P (P11, P21, P31, P41, P51) of the first column are folded so as to overlap the back side of the power generation modules P (P12, P22, P32, P42, P52) of the second column (mountain folding). Next, the power generation modules P of the first and second columns overlapping in the vertical direction are folded so as to overlap the front side of the power generation modules P (P13, P23, P33, P43, P53) of the third column (valley folding). Next, the power generation modules P of the first to third columns overlapping in the vertical direction are folded so as to overlap the back side of the power generation modules P (P14, P24, P34, P44, P54) of the fourth column (mountain folding). Then, the power generation modules P of the first to fourth columns overlapping in the vertical direction are folded so as to overlap the front side of the power generation modules P (P15, P25, P35, P45, P55) of the fifth column (valley folding).

By accordion-folding the power generation module connected body 10 in the row direction so as to alternate between mountain folding and valley folding in this way, the row direction folded state illustrated in FIGS. 7A and 7B can be achieved. The parts subjected to mountain folding and the parts subjected to valley folding may be replaced with each other.

As described above, the row-direction connection portions 13 are configured to satisfy the relationship "row-direction length $C \geq 2L$". Accordingly, the length of the row-direction connection portions 13 between power generation modules P is sufficient in both of the parts subjected to mountain folding and the parts subjected to valley folding as illustrated in FIG. 7B, enabling smooth folding.

Figure 8:
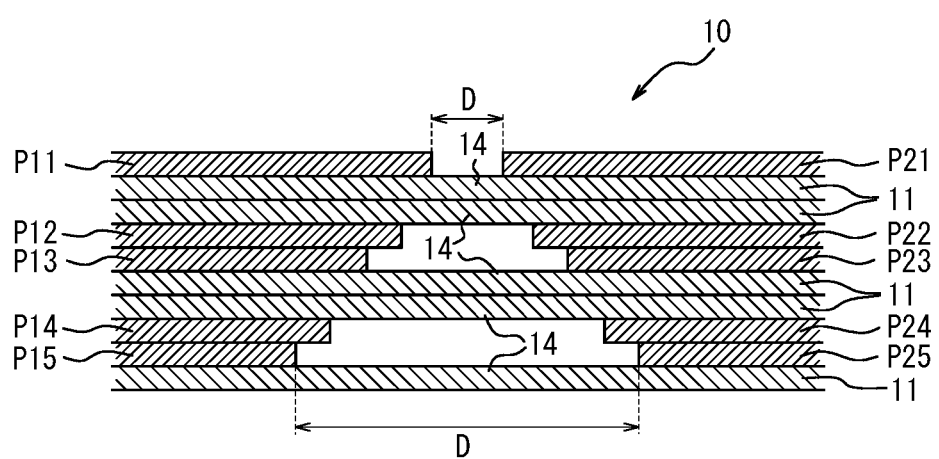
FIG. 8 is a partially enlarged sectional view of the power generation module connected body illustrated in FIG. 1 in a row direction folded state.

FIG. 8 is a partially enlarged sectional view of the power generation module connected body 10 in a row direction folded state, along the column direction. As illustrated in FIG. 8, folding is made so that the length D along the column direction of the column-direction connection portions 14 which connect together the power generation modules P of the first row (P11, P12, P13, P14, P15) and the power generation modules P of the second row (P21, P22, P23, P24, P25) which are adjacent in the column direction increases in the downward direction. Likewise, folding is made so that the column direction length D of the column-direction connection portions 14 which connect together the power generation modules P of the third row and the power generation modules P of the fourth row which are adjacent in the column direction increases in the downward direction (not illustrated). On the other hand, folding is made so that the column direction length D of the column-direction connection portions 14 which connect together the power generation modules P of the second row and the power generation modules P of the third row which are adjacent in the column direction, and the column-direction length D of the column-direction connection portions 14 which connect together the power generation modules P of the fourth row and the power generation modules P of the fifth row which are adjacent in the column direction increase in the upward direction.

Figure 9A:
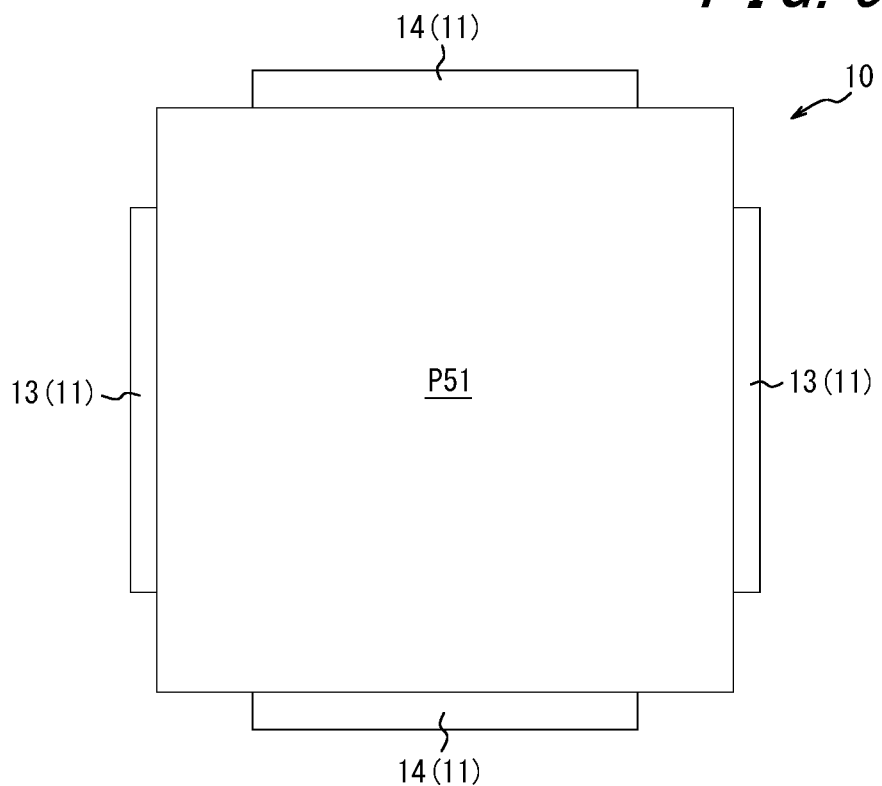
FIG. 9A is a top view of the power generation module connected body illustrated in FIG. 1 in a stored state.
Figure 9B:
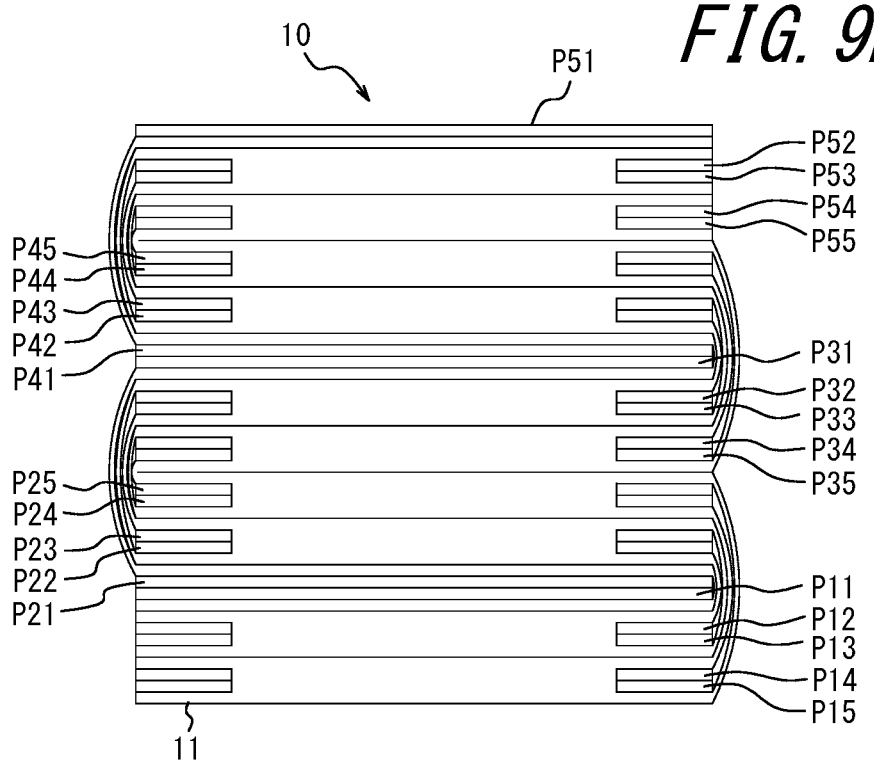
FIG. 9B is a side view of the power generation module connected body illustrated in FIG. 1 in a stored state.

FIG. 9A is a top view of the power generation module connected body 10 in a stored state. FIG. 9B is a side view of the power generation module connected body 10 in a stored state. As a result of accordion-folding the power generation modules P of the rows in the column direction from the row direction folded state illustrated in FIGS. 7A and 7B and overlapping all power generation modules P, the power generation module connected body 10 is put in a stored state illustrated in FIGS. 9A and 9B.

First, the power generation modules P (P11, P12, P13, P14, P15) of the first row overlapping in the vertical direction are folded so as to overlap the front side of all of the power generation modules P (P21, P22, P23, P24, P25) of the second row overlapping in the vertical direction (valley folding). Next, the power generation modules P of the first and second rows overlapping in the vertical direction are folded so as to overlap the back side of all of the power generation modules P (P31, P32, P33, P34, P35) of the third row overlapping in the vertical direction (mountain folding). Next, the power generation modules P of the first to third rows overlapping in the vertical direction are folded so as to overlap the front side of all of the power generation modules P (P41, P42, P43, P44, P45) of the fourth row overlapping in the vertical direction (valley folding). Then, the power generation modules P of the first to fourth rows overlapping in the vertical direction are folded so as to overlap the back side of all of the power generation modules P (P51, P52, P53, P54, P55) of the fifth row overlapping in the vertical direction (mountain folding).

By accordion-folding the power generation module connected body 10 in a row direction folded state in the column direction so as to alternate between mountain folding and valley folding in this way, the stored state illustrated in FIGS. 9A and 9B can be achieved.

When the power generation module connected body 10 transitions to a stored state by being further folded from a row direction folded state, the surfaces of adjacent power generation modules P can be made to overlap each other in the part in which the column direction length D of the column-direction connection portions 14 which connect together the power generation modules P adjacent in the column direction increases in the downward direction as illustrated in FIG. 8. By such folding, the column direction width D of the column-direction connection portions 14 which connect together power generation modules P with a longer distance in the vertical direction in a folded state is longer, so that the power generation module connected body 10 can be folded smoothly. In more detail, the column direction width D of the column-direction connection portions 14 is 2L or more longer than the column direction width D of the column-direction connection portions 11 located immediately on the inner side in a folded state, and therefore smooth folding can be achieved without being obstructed by the column-direction connection portions 14 located on the inner side. The storability in a folded state can thus be improved.

Figure 10:
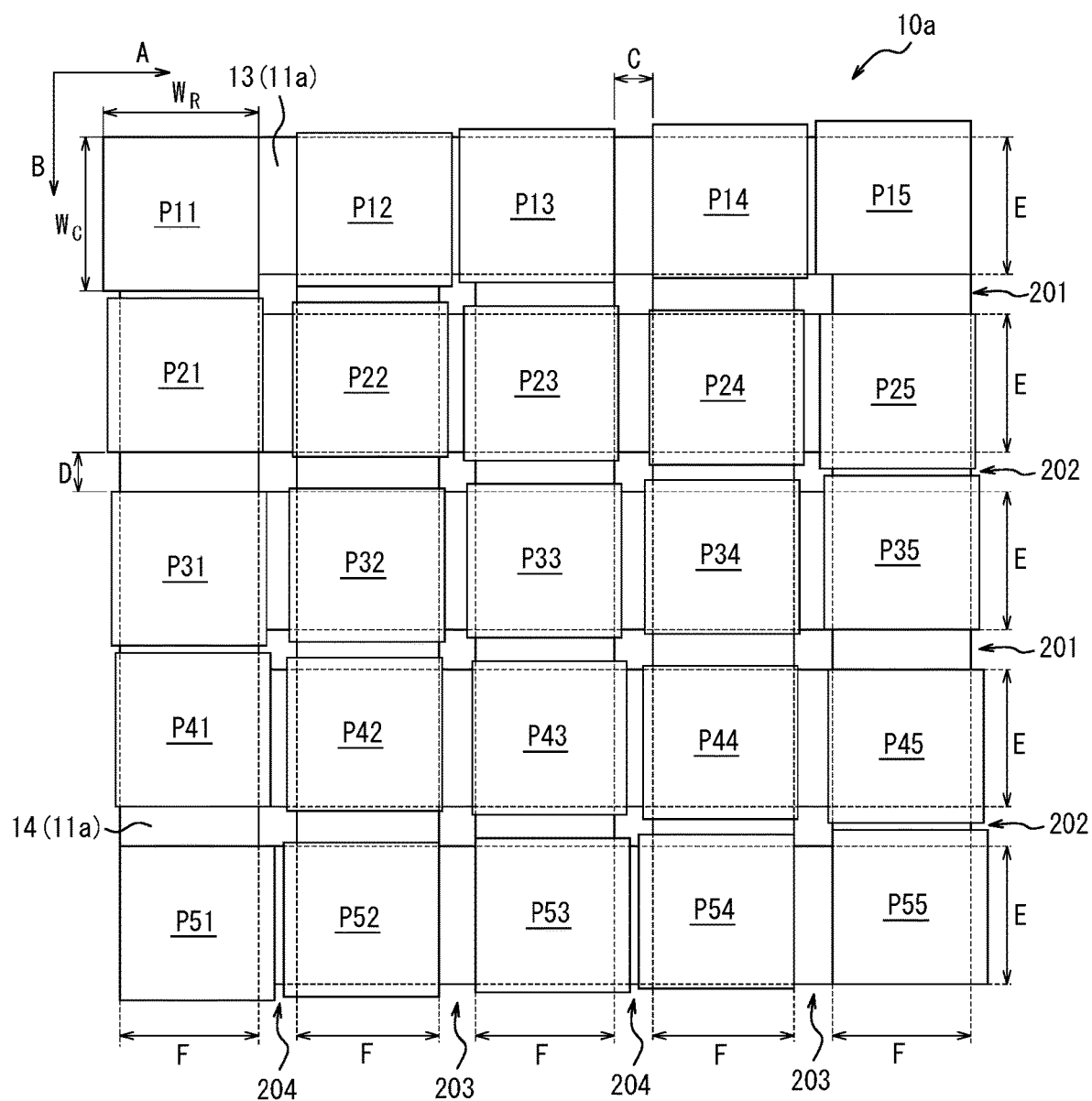
FIG. 10 is a top view of a first modification of the power generation module connected body illustrated in FIG. 1 in an unfolded state.

Modifications of the power generation module connected body 10 are described below. FIG. 10 is a top view of a power generation module connected body 10a in an unfolded state according to the first modification of the power generation module connected body 10. The power generation module connected body 10a has a configuration similar to that of the power generation module connected body 10 except for the configuration described below.

In the case of the power generation module connected body 10a, the row-direction width C of the row-direction connection portions 13 of the connection portion 11a satisfies the following relationships. The power generation module connected body 10a has, alternately along the row direction A, a first type column 203 satisfying the relationships $C_1 \geq 2L$ and $C_x \geq C_{x-1} + 2L$ (see FIG. 10) and a second type column 204 satisfying the relationships $C_m \geq 2L$ and $C_x \geq C_{x+1} + 2L$ (see FIG. 10), where m is an integer of 2 or more which represents the number of rows of the power generation modules P arranged in a matrix and $C_x$ is the row-direction length of the row-direction connection portions 13 in the x-th row. In other words, the row-direction length C of the row-direction connection portions 13 is 2L or more in the first row for the first type column 203 and increases by 2L or more with each increase in the number of rows. The row-direction length C of the row-direction connection portions 13 is 2L or more in the last row for the second type column 204 and increases by 2L or more with each decrease in the number of rows.

In detail, in the power generation module connected body 10a as illustrated in FIG. 10, the row-direction length C of the row-direction connection portions 13 which connect together the power generation modules P (P11, P21, P31, P41, P51) of the first column and the power generation modules P (P12, P22, P32, P42, P52) of the second column which are adjacent in the row direction A satisfies the relationships $C_1 \geq C_2 + 2L$, $C_2 \geq C_3 + 2L$, $C_3 \geq C_4 + 2L$, $C_4 \geq C_5 + 2L$, $C_5 \geq 2L$ sequentially from the first row, forming the second type column 204. Likewise, the row-direction length C of the row-direction connection portions 13 which connect together the power generation modules P (P13, P23, P33, P43, P53) of the third column and the power generation modules P (P14, P24, P34, P44, P54) of the fourth column which are adjacent in the row direction A satisfies the relationships $C_1 \geq C_2 + 2L$, $C_2 \geq C_3 + 2L$, $C_3 \geq C_4 + 2L$, $C_4 \geq C_5 + 2L$, $C_5 \geq 2L$ sequentially from the first row, forming the second type column 204.

Meanwhile, the row-direction length C of the connection portions 13 which connect together the power generation modules P (P12, P22, P32, P42, P52) of the second column and the power generation modules P (P13, P23, P33, P43, P53) of the third column which are adjacent in the row direction A satisfies the relationships $C_1 \geq 2L$, $C_2 \geq C_1 + 2L$, $C_3 \geq C_2 + 2L$, $C_4 \geq C_3 + 2L$, $C_5 \geq C_4 + 2L$ sequentially from the first row, forming the first type column 203. Likewise, the row-direction length C of the connection portions 13 which connect together the power generation modules P (P14, P24, P34, P44, P54) of the fourth column and the power generation modules P (P15, P25, P35, P45, P55) of the fifth column which are adjacent in the row direction A satisfies the relationships $C_1 \geq 2L$, $C_2 \geq C_1 + 2L$, $C_3 \geq C_2 + 2L$, $C_4 \geq C_3 + 2L$, $C_5 \geq C_4 + 2L$ sequentially from the first row, forming the first type column 203.

Thus, in the power generation module connected body 10a, the first type row 201 and the second type row 202 are alternately arranged along the column direction.

In the power generation module connected body 10a, the first row is the first type row 201 and the first column is the second type column 204, or the first row is the second type row 202 and the first column is the first type column 203. In other words, the power generation module connected body 10a satisfies the condition wherein the first row is the first type row 201 and the first column is the second type column 204, or the condition wherein the first row is the second type row 202 and the first column is the first type column 203. Specifically, as illustrated in FIG. 10, in the power generation module connected body 10a, the first row is the first type row 201 and the first column is the second type column 204.

The power generation module connected body 10a having the structure described above can be folded from any of the row direction and the column direction to be in a stored state, in addition to having the same advantageous effect as that of the power generation module connected body 10. Moreover, the power generation module connected body 10a satisfies the condition wherein the first row is the first type row 201 and the first column is the second type column 204, or the condition wherein first row is the second type row 202 and the first column is the first type column 203. Hence, each power generation module P is prevented from being far from both of a power generation module P adjacent in the row direction and a power generation module P adjacent in the column direction. The stability of the power generation modules P can thus be improved.

As with the column-direction width E of the row-direction connection portions 13 discussed above for the power generation module connected body 10, the row-direction width F of the column-direction connection portions 14 of the power generation module connected body 10a satisfies the relationship $F \leq W_R - L$. Further, opposing ends in the row direction A of the column-direction connection portions 14 do not protrude outward along the row direction A beyond any of the power generation modules P connected with the row-direction connection portions 14. Thus, it is possible to further improve the storability of the power generation module connected body 10a while providing the same advantageous effect as that of the power generation module connected body 10.

Further, in the example illustrated in FIG. 10, the row-direction width F of the column-direction connection portions 14 satisfies the relationship $F \leq W_R - L \times (m-1)$. In this example, the power generation module connected body 10a has 5 rows of power generation modules P (m=5), satisfying the relationship $F \leq W_R - 4L$. In the example illustrated in FIG. 10, $F = W_R - 4L$ holds. Also as illustrated in FIG. 10, opposing ends in the row direction A of the plurality of column direction-connection portions 14 arranged in the same column are aligned. Thus, it is possible to further improve the design and productivity of the power generation module connected body 10a while providing the same advantageous effect as that of the power generation module connected body 10.

Figure 11:
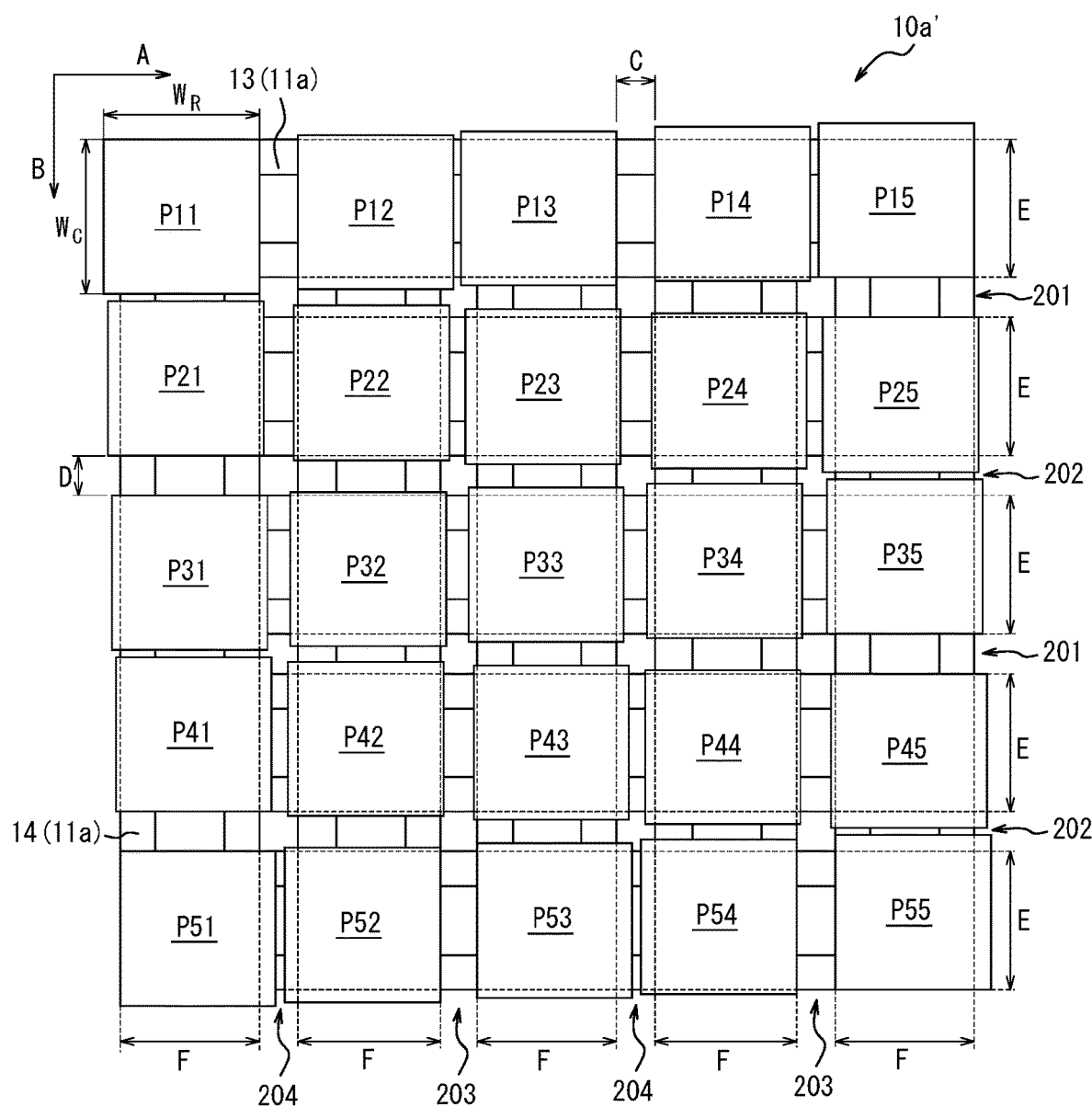
FIG. 11 is a top view of the modification of the power generation module connected body illustrated in FIG. 10 in an unfolded state.

FIG. 11 is a top view of a power generation module connected body 10a' in an unfolded state according to a modification of the power generation module connected body 10a. The power generation module connected body 10a' has the same configuration as the power generation module connected body 10a except for the configuration described below.

As illustrated in FIG. 11, the row-direction connection portions 13 of the power generation module connected body 10a' are each divided into two along the column direction B. Similarly, the column-direction connection portions 14 of the power generation module connected body 10a' are each divided into two along the row direction A. Even in the case of a power generation module connected body 10a' which includes row-direction connection portions 13 and column-direction connection portions 14 having such a configuration, with the row-direction connection portions 13 and column-direction connection portions 14 being included that satisfy the same relationships as those of the power generation module connected body 10a, it is possible to provide the same advantageous effect as that of the power generation module connected body 10a.

Figure 12A:
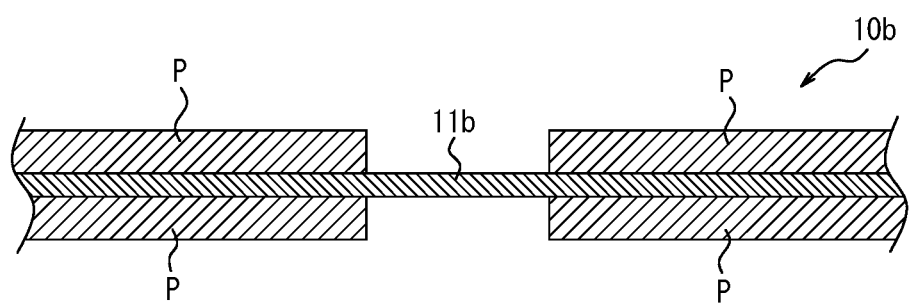
FIG. 12A is a partially enlarged sectional view of a second modification of the power generation module connected body illustrated in FIG. 1 in an unfolded state.

FIG. 12A is a partially enlarged sectional view of a power generation module connected body 10b in an unfolded state according to a second modification of the power generation module connected body 10. The power generation module connected body 10b has the same configuration as the power generation module connected body 10 except that the power generation modules P are located above and below a connection portion 11b. In addition to the same advantageous effect as that of the power generation module connected body 10, the power generation module connected body 10b has an effect of, when folded between adjacent power generation modules P, reducing the burden on the connection portion 11b associated with the folding, because the power generation modules P are located on the inner side of the connection portion 11b.

Figure 12B:
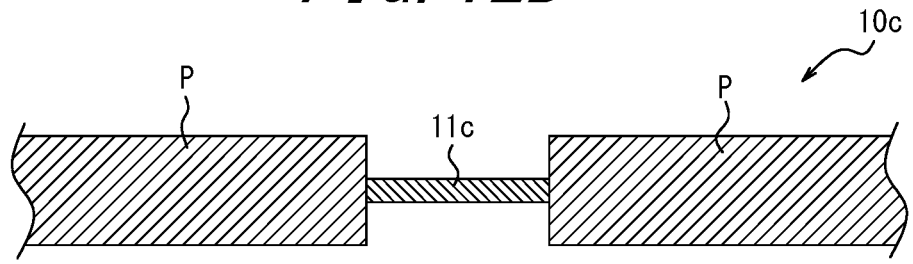
FIG. 12B is a partially enlarged sectional view of a third modification of the power generation module connected body illustrated in FIG. 1 in an unfolded state.

FIG. 12B is a partially enlarged sectional view of a power generation module connected body 10c in an unfolded state according to a third modification of the power generation module connected body 10. The power generation module connected body 10c has the same configuration as the power generation module connected body 10 except that a connection portion 11c is located to connect adjacent power generation modules P to each other near the vertical center of the power generation modules P. In addition to the same advantageous effect as that of the power generation module connected body 10, the power generation module connected body 10c has an effect of, when folded between adjacent power generation modules P, reducing the burden on the connection portion 11c associated with the folding, because the power generation modules P are located on the inner side of the connection portion 11c.

Figure 13:
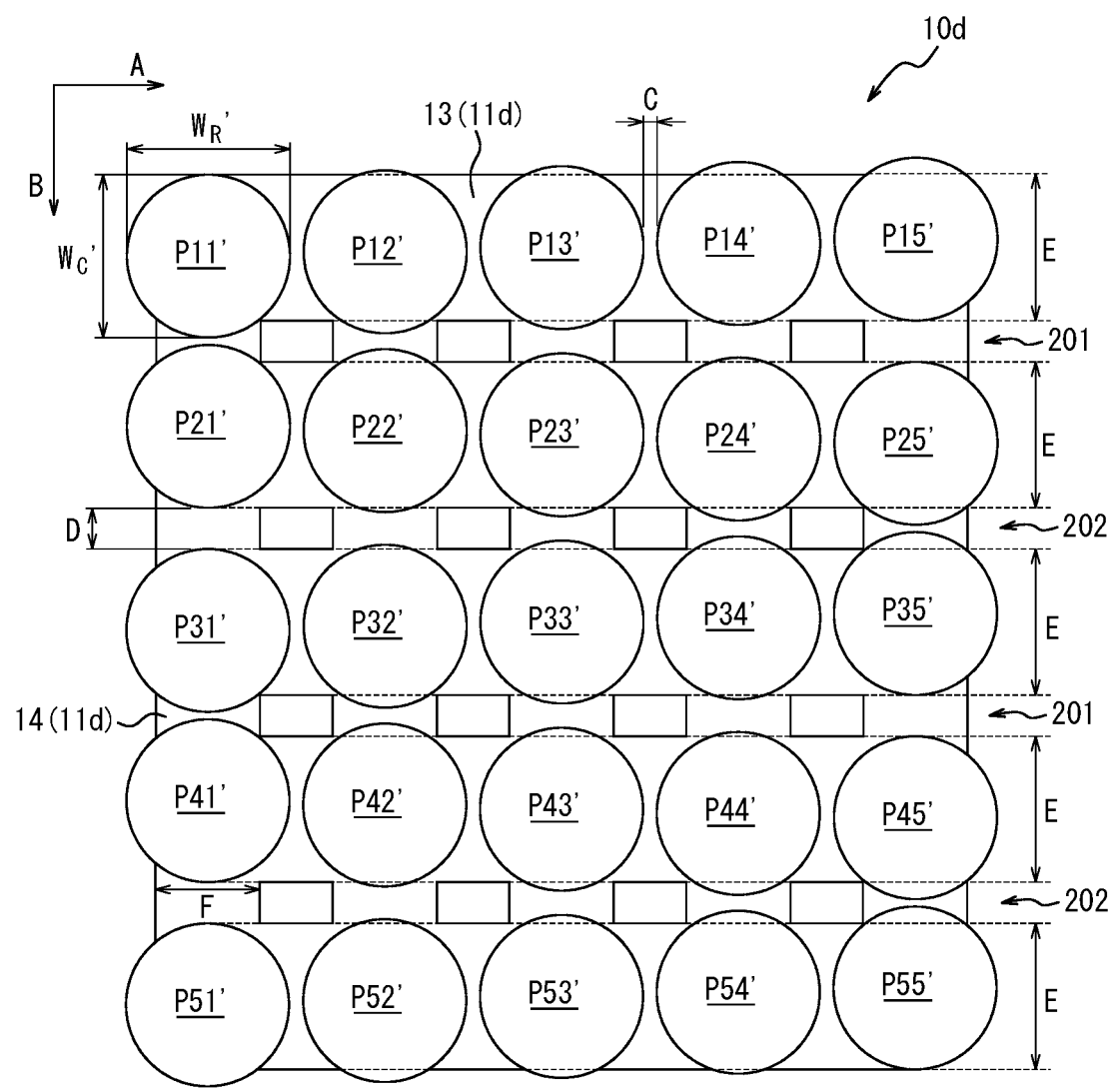
FIG. 13 is a top view of a fourth modification of the power generation module connected body illustrated in FIG. 1 in an unfolded state.

FIG. 13 is a top view of a power generation module connected body 10d in an unfolded state according to a fourth modification of the power generation module connected body 10. The power generation module connected body 10d is the same as the power generation module connected body 10 except that power generation modules P' which are circular in top view are used instead of the power generation modules P which are rectangular in top view. In this case, as illustrated in FIG. 13, the row-direction length C of the row-direction connection portions 13 at the connection portion 11d is equal to the shortest interval along the row direction A between the power generation modules P' connected together by the row-direction connection portions 13. Likewise, as illustrated in FIG. 13, the column-direction length D of the column-direction connection portions 14 at the connection portion 11d is equal to the shortest interval along the column direction between the power generation modules P' connected together by the column-direction connection portions 14. The length $W_R'$ along the row direction A of the power generation modules P' and the length $W_C'$ along the column direction B of the power generation modules P' are both equal to the diameter of circles which denote the power generation modules P'. As long as the connection portion 11d satisfies the relationships described above, the power generation modules P' are not limited to be circular in top view and may have any other shape in top view, such as a polygon.

The above merely describes one of the disclosed embodiments, and a variety of modifications may be made within the scope of the claims. For example, while the arrangements of the power generation modules P and P', the connection portions 11 to 11d, and the like are described above using rows and columns, such rows and columns are defined for the purpose of illustration, and may be replaced with each other. Moreover, the upward direction and the downward direction are defined for the purpose of illustration, and may be replaced with each other. Although the above describes the power generation module connected bodies 10 to 10d in which the power generation modules P or P' are arranged in a matrix of 5 rows and 5 columns, the power generation modules P or P' may be arranged in a matrix of 2 rows or more and 2 columns or more.

In each of the connection portions 11 to 11d according to this embodiment, for example, the conductor layer 112 may be composed of a flexible printed circuit board (FPC) in which a conductor such as copper foil is sandwiched between insulators such as a base film and a cover film.

In this case, each of the connection portions 11 to 11d does not need include the protective layer 113 because the conductor layer 112 composed of an FPC has a protection function.

Figure 14A:
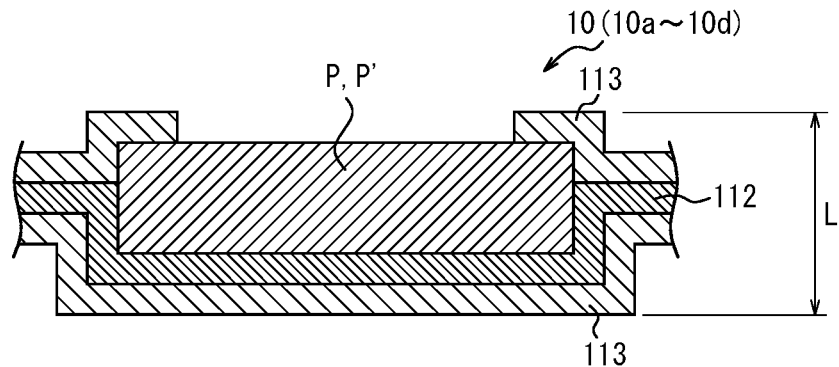
FIGS. 14A to 14C illustrate examples of a power generation module connected body having a conductive layer that is disposed such that adjacent power generation modules are connected vertically.
Figure 14B:
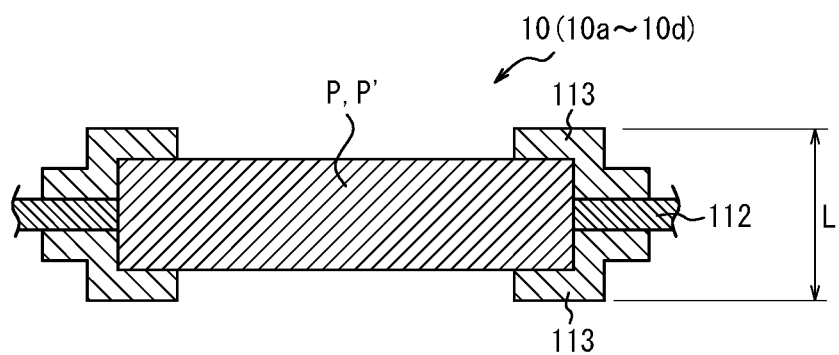
Figure 14C:
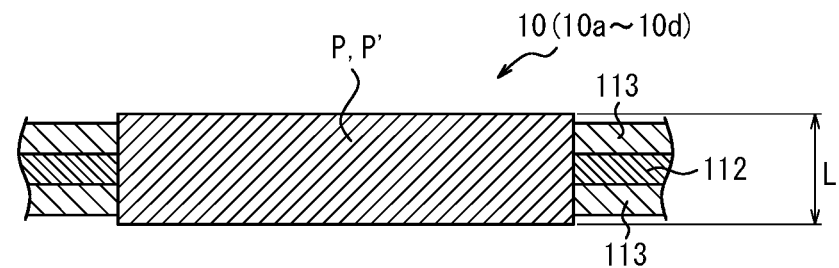

FIGS. 14A to 14C illustrate examples of the power generation module connected body 10 (10a to 10d) in which, when the conductor layer 112 is composed of an FPC, the conductor layer 112 is located so as to connect adjacent power generation modules P or P' near the vertical center. The power generation module connected body 10 (10a to 10d) refer to the power generation module connected body 10, 10a, 10b, 10c or 10d, and means that the configurations illustrated in FIGS. 14A to 14C are applicable to any of the power generation module connected bodies described above. As illustrated in FIGS. 14A to 14C, when the conductor layer 112 is composed of an FPC, each of the connection portions 11 to 11d may include the protective layer 113. The protective layer 113 may be located to cover the power generation module P or P' excluding part of the front side as illustrated in FIG. 14A. Alternatively, the protective layer 113 may be located to cover the connecting part between the power generation module P or P' and the conductor layer 112 from above and below as illustrated in FIG. 14B. Alternatively, the protective layer 113 may be located to cover the conductor layer 112 from above and below as illustrated in FIG. 14C. As mentioned above with reference to FIGS. 4A to 4C, in the case where the conductor layer 112 and/or the protective layer 113 is present above or below the power generation module P, P', the thickness L of the power generation module P, P' in the vertical direction is taken to be the thickness of the whole power generation module connected body 10 to 10d including the thickness of the conductor layer 112 and/or the protective layer 113.

The form of connection of the main body 20 to the power generation modules P, P' in the power generation device 1 according to this embodiment is not limited. For example, the main body 20 may be integrated with any of the power generation modules P, P', or connected to an end of any of the power generation modules P, P'. The main body 20 may be removable from the power generation module P, P'.

The power generation module connected bodies 10 to 10d according to this embodiment are not limited to be used together with the main body 20 to form the power generation device 1, and may be used independently of the main body 20. In detail, the power generation module connected bodies 10 to 10d according to this embodiment may include, for example, an interface having the same functions as the external IF 26 of the main body 20 and, when an external device is connected directly to the interface, supply electric power to the connected external device.

As one aspect of the power generation modules P, P' according to this embodiment, photoelectric conversion modules including the above-mentioned solar cells as the power generation section 12 may be used. As one aspect of the power generation module connected bodies 10 to 10d according to this embodiment, a photoelectric conversion module connected body using the above-mentioned photoelectric conversion modules may be used. As one aspect of the power generation device 1, a photoelectric conversion device including the above-mentioned photoelectric conversion module connected body may be used.

Each structure described with regard to the power generation module connected bodies 10 to 10d according to this embodiment is also applicable to any panel connected body including any flat panels not limited to the power generation modules P, P' and any connection portion not limited to a connection portion including a conductor.

INDUSTRIAL APPLICABILITY

It is therefore possible to provide a panel connected body, a power generation module connected body and a power generation device having improved storability in a folded state.

REFERENCE SIGNS LIST 1 power generation device
10, 10a, 10a', 10b, 10c, 10d power generation module connected body
11, 11a, 11b, 11c, 11d connection portion
12 power generation section
13 row-direction connection portion
14 column-direction connection portion
20 main body
21 interface
22 booster circuit section
23 power generation module voltage detection section
24 AC adapter voltage detection section
25 rechargeable battery
26 external interface
27 charge/discharge control circuit
28 controller
30 AC adapter
31 power outlet
32 AC/DC converter
112 conductor layer
113 protective layer
201 first type row
202 second type row
203 first type column
204 second type column
A row direction
B column direction
C row-direction length of row-direction connection portion D column-direction length of column-direction connection portion
E column-direction width of row-direction connection portion
F row-direction width of column-direction connection portion
L thickness of power generation module in vertical direction
P, P' power generation module
$W_R$, $W_R'$ length of power generation module along row direction
$W_C$, $W_C'$ length of power generation module along column direction

The invention claimed is:

1. A panel connected body, comprising:
a plurality of flat panels arranged in a matrix of m rows and n columns, where m≥3 and n≥3;
a plurality of row-direction connection portions which connect together the panels that are adjacent in a row direction; and
a plurality of column-direction connection portions which connect together the panels that are adjacent in a column direction, wherein
the panel connected body is foldable between adjacent panels of the plurality of panels,
a first type row satisfying relationships $D_1 \geq 2L$ and $D_y \geq D_{y-1} + 2L$ and a second type row satisfying relationships $D_n \geq 2L$ and $D_y \geq D_{y+1} + 2L$ are alternately included, where $D_y$ is a length along the column direction of the column-direction connection portions in a y-th column of the column-direction connection portions, y is greater than 1, and L is a thickness of the panels,
a first type column satisfying relationships $C_1 \geq 2L$ and $C_x \geq C_{x-1} + 2L$ and a second type column satisfying relationships $C_m \geq 2L$ and $C_x \geq C_{x+1} + 2L$ are alternately included, where $C_x$ is a length along the row direction of the row-direction connection portions in an x-th row of the row-direction connection portions, and x is greater than 1,
the panel connected body satisfies a relationship $E \leq W_C - L$, where $W_C$ is a length along the column direction of the panels, and E is a length along the column direction of the row-direction connection portions, and
opposing ends in the column direction of the row-direction connection portions do not protrude outward in the column direction beyond any of the panels connected together with the row-direction connection portions.

2. The panel connected body according to claim 1, wherein
the panel connected body satisfies a relationship $E \leq W_C - L \times (n-1)$ and opposing ends in the column direction of the plurality of row-direction connection portions arranged in the same row are aligned along the row direction.

3. The panel connected body according to claim 1, wherein
a first row is the first type row and a first column is the second type column, or the first row is the second type row and the first column is the first type column.

4. The panel connected body according to claim 3, wherein
the panel connected body satisfies a relationship $F \leq W_R - L$, where $W_R$ is a length along the row direction of the panels and F is a length along the row direction of the row-direction connection portions, and
opposing ends in the row direction of the column-direction connection portions do not protrude outward in the row direction beyond any of the panels connected together with the column-direction connection portions.

5. The panel connected body according to claim 4, wherein
the panel connected body satisfies a relationship $F \leq W_R - L \times (m-1)$ and opposing ends in the row direction of the plurality of column-direction connection portions arranged in the same column are aligned.

6. A power generation module connected body, comprising
the panel connected body according to claim 1 wherein the panels are power generation modules, and at least one of the row-direction connection portion and the column-direction connection portion comprises a conductor electrically connecting the power generation modules.

7. The power generation module connected body according to claim 6, wherein
at least one of the row-direction connection portion and the column-direction connection portion is located along a bottom end of the power generation module connected body, and further comprises a conductor layer including the conductor and a protective layer stacked in a vertical direction, and
the protective layer is located closer to the bottom end than the conductor layer.

8. The power generation module connected body according to claim 6, wherein
the power generation modules are photoelectric conversion modules.

9. A power generation device, comprising:
the power generation module connected body according to claim 6; and
a main body electrically connected to the power generation module connected body.

* * * * *